(12) United States Patent
Lin

(10) Patent No.: US 8,893,769 B2
(45) Date of Patent: Nov. 25, 2014

(54) HEAT SINK WIND GUIDE STRUCTURE AND THERMAL MODULE THEREOF

(75) Inventor: Sheng-Huang Lin, Sinjhuang (TW)

(73) Assignee: Asia Vital Components Co., Ltd., Taipei County (TW)

( * ) Notice: Subject to any disclaimer, the term of this patent is extended or adjusted under 35 U.S.C. 154(b) by 506 days.

(21) Appl. No.: 12/824,439

(22) Filed: Jun. 28, 2010

(65) Prior Publication Data

US 2011/0315357 A1 Dec. 29, 2011

(51) Int. Cl.
| F28F 7/00 | (2006.01) |
| F24H 3/02 | (2006.01) |
| H01L 23/467 | (2006.01) |
| F28F 21/08 | (2006.01) |
| F28D 15/02 | (2006.01) |
| F28F 1/32 | (2006.01) |
| H01L 23/367 | (2006.01) |
| H01L 23/427 | (2006.01) |

(52) U.S. Cl.
CPC .......... F28F 21/084 (2013.01); F28D 15/0233 (2013.01); F28F 1/32 (2013.01); H01L 23/3672 (2013.01); H01L 23/427 (2013.01); H01L 23/467 (2013.01); F28F 2250/08 (2013.01); F28F 2215/00 (2013.01); F28F 2255/16 (2013.01)

USPC .......................... 165/80.3; 165/121; 165/185

(58) Field of Classification Search
USPC ........................ 165/80.3, 121, 185
See application file for complete search history.

(56) References Cited

U.S. PATENT DOCUMENTS

| 6,816,373 B2 * | 11/2004 | Lee et al. ...................... 361/697 |
| 7,038,911 B2 * | 5/2006 | Foster et al. .................. 361/695 |
| 2007/0090737 A1 * | 4/2007 | Hu et al. .......................... 313/11 |
| 2007/0119566 A1 * | 5/2007 | Peng ............................ 165/80.3 |

* cited by examiner

*Primary Examiner* — Allen Flanigan
*Assistant Examiner* — Jon T Schermerhorn

(57) ABSTRACT

A heat sink wind guide structure and a thermal module thereof. The heat sink wind guide structure includes a heat sink having multiple radiating fins and a wind incoming side. Each two adjacent radiating fins define therebetween a heat dissipation flow way in communication with the wind incoming side. The radiating fins include a first radiating fin and a second radiating fin, which are respectively positioned on two opposite outer sides of the heat sink. The first radiating fin has a first extension end and the second radiating fin has a second extension end. The heat sink is assembled with a fan to form the thermal module. By means of the first and second extension ends, the heat of the heat sink can be dissipated quickly and the heat dissipation airflow can be exhausted from many sides of the heat sink to greatly enhance heat dissipation efficiency.

8 Claims, 11 Drawing Sheets

US 8,893,769 B2

HEAT SINK WIND GUIDE STRUCTURE AND THERMAL MODULE THEREOF

FIELD OF THE INVENTION

The present invention relates to a heat sink wind guide structure and a thermal module thereof, and more particularly to a thermal module with heat sink wind guide structure, in which the heat dissipation airflow is exhausted from many sides of the heat sink to greatly enhance heat dissipation efficiency.

BACKGROUND OF THE INVENTION

Following the advance of semiconductor technologies, the volume of integrated circuit has become smaller and smaller. In order to process more data, the current integrated circuit with the same volume contains several times more calculation components than the conventional integrated circuit. The larger the number of the calculation components contained in the integrated circuit is, the greater the heat generated by the calculation components in working. As exemplified with a common central processor, in a full-load state, the heat generated by the central processor may burn down the entire central processor. Therefore, heat dissipation of the integrated circuit has become a critical topic.

Please refer to FIG. 1, which is a perspective assembled view of a conventional thermal module 1. The conventional thermal module 1 is composed of a fan 11 and a cooperative heat sink 12. The fan 11 is mated with one side of the heat sink 12. The heat sink 12 has multiple radiating fins 121 defining therebetween multiple heat dissipation flow ways 122. The fan 11 has a wind exit side 111 adapted to the heat dissipation flow ways 122.

Two ends of the heat dissipation flow way 122 between the radiating fins 121 are open. In operation, the fan 11 forcedly guides heat dissipation airflow 2 to dissipate heat from the heat sink 12. The heat dissipation airflow 2 goes from the wind exit side 111 into the heat dissipation flow ways 122. Then the heat dissipation airflow 2 is exhausted from two ends of the heat dissipation flow ways 122 to achieve heat dissipation effect. However, the heat dissipation airflow 2 can only flow out from two sides of the heat sink 12. Therefore, the heat dissipation efficiency is quite limited and the heat may accumulate in the heat sink 12 to lower the heat dissipation effect. Moreover, such thermal module 1 is only applicable to one single heat source. Accordingly, the conventional thermal module 1 has the following shortcomings:
1. The heat dissipation efficiency of the conventional thermal module is low.
2. The heat is likely to accumulate in the heat sink of the conventional thermal module.
3. The heat dissipation effect of the conventional thermal module is poor.

SUMMARY OF THE INVENTION

A primary object of the present invention is to provide a heat sink wind guide structure, in which the heat dissipation airflow is exhausted from many sides of the heat sink to greatly enhance heat dissipation efficiency.

A further object of the present invention is to provide a thermal module with heat sink wind guide structure, in which the heat dissipation airflow is exhausted from many sides of the heat sink to greatly enhance heat dissipation efficiency.

To achieve the above and other objects, the heat sink wind guide structure of the present invention includes a heat sink having multiple radiating fins and a wind incoming side. Each two adjacent radiating fins define therebetween a heat dissipation flow way in communication with the wind incoming side. The radiating fins include a first radiating fin and a second radiating fin, which are respectively positioned on two opposite outer sides of the heat sink. The first radiating fin has a first extension end protruding from the first radiating fin. The second radiating fin has a second extension end protruding from the second radiating fin.

The thermal module with heat sink wind guide structure of the present invention includes a heat sink and a fan. The heat sink has multiple radiating fins and a wind incoming side. Each two adjacent radiating fins define therebetween a heat dissipation flow way in communication with the wind incoming side. The radiating fins include a first radiating fin and a second radiating fin, which are respectively positioned on two opposite outer sides of the heat sink. The first radiating fin has a first extension end protruding from the first radiating fin. The second radiating fin has a second extension end protruding from the second radiating fin. The fan is mated with the wind incoming side of the heat sink.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
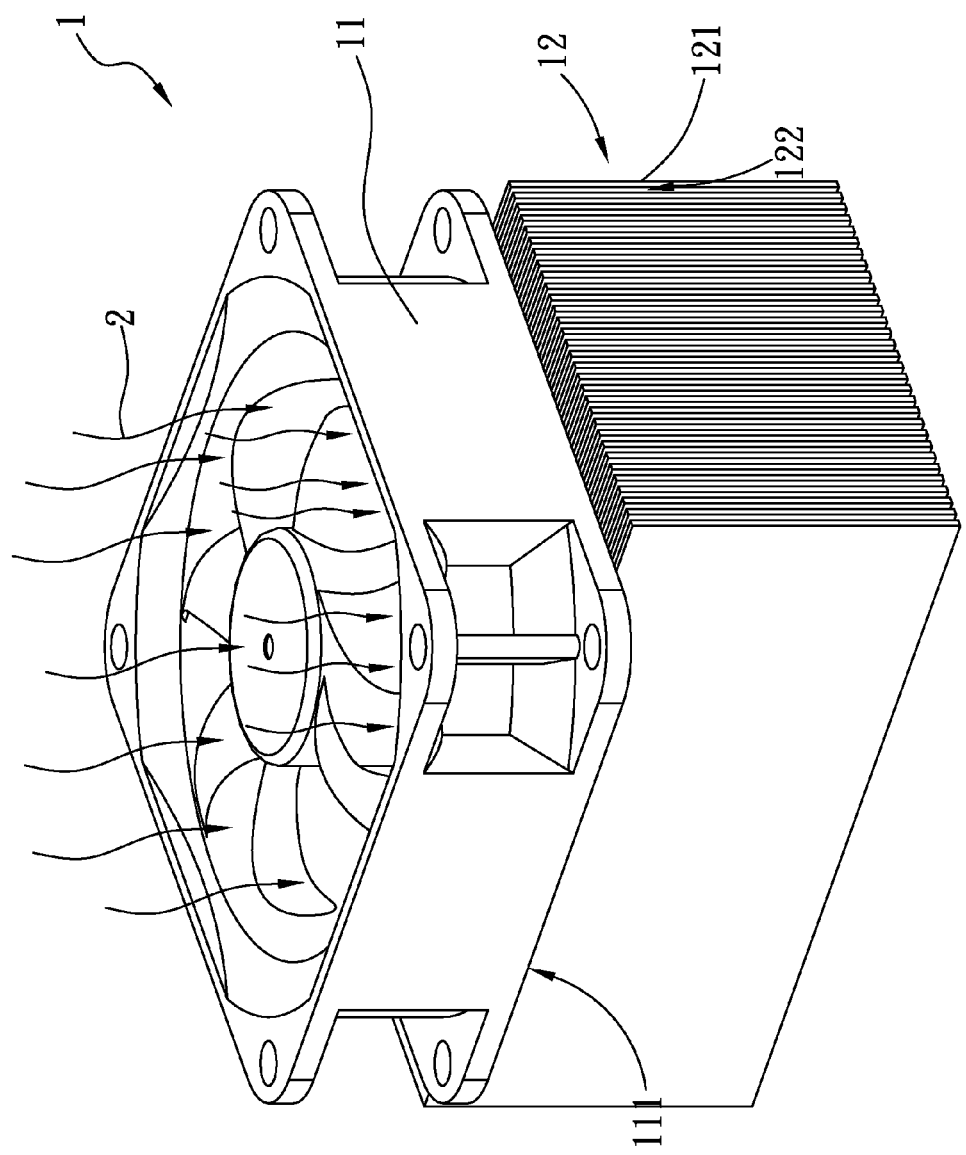
FIG. 1 is a perspective assembled view of a conventional thermal module.
Figure 2A:
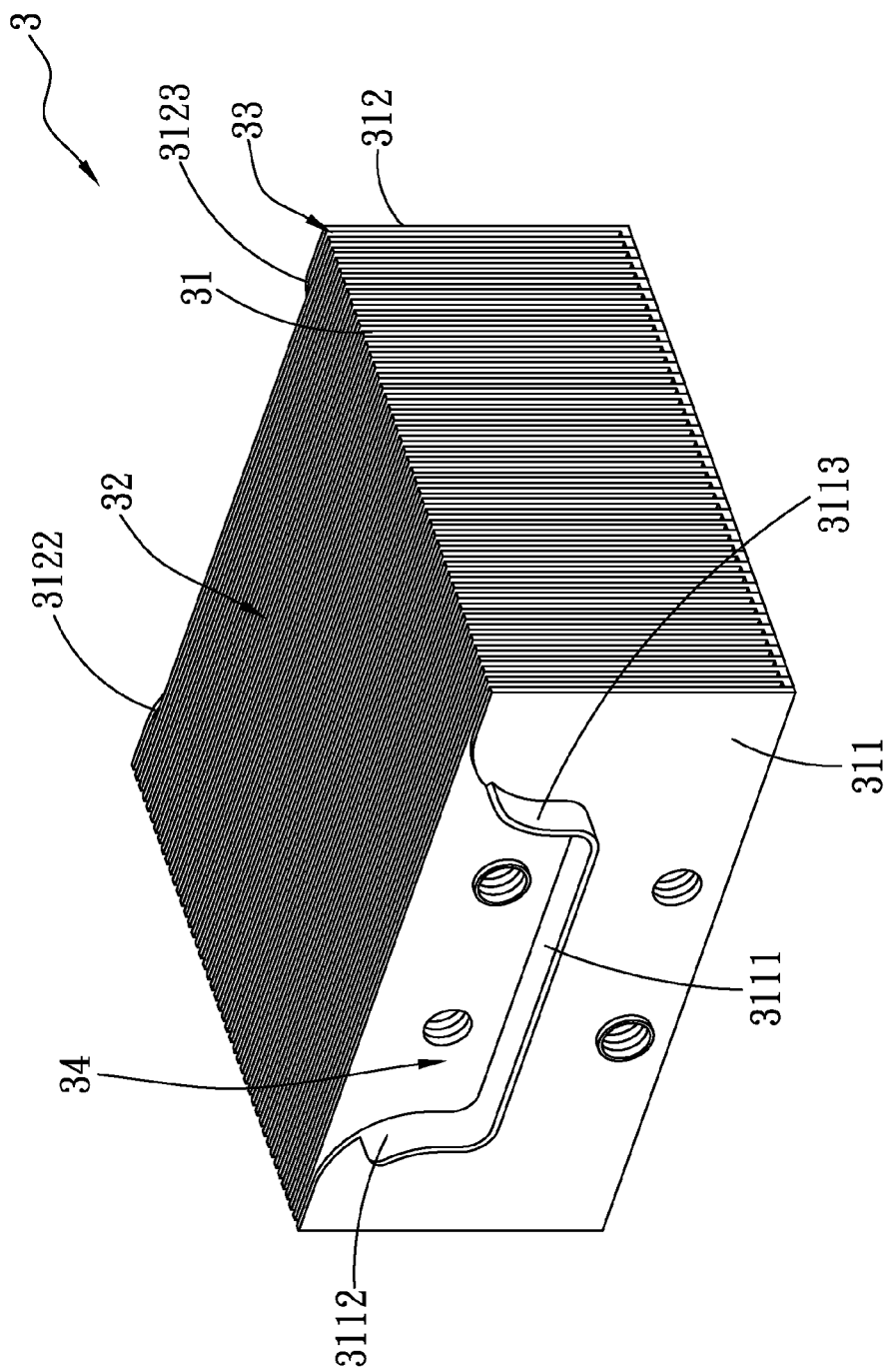
FIG. 2a is a perspective view of a first embodiment of the heat sink wind guide structure of the present invention.
Figure 2B:
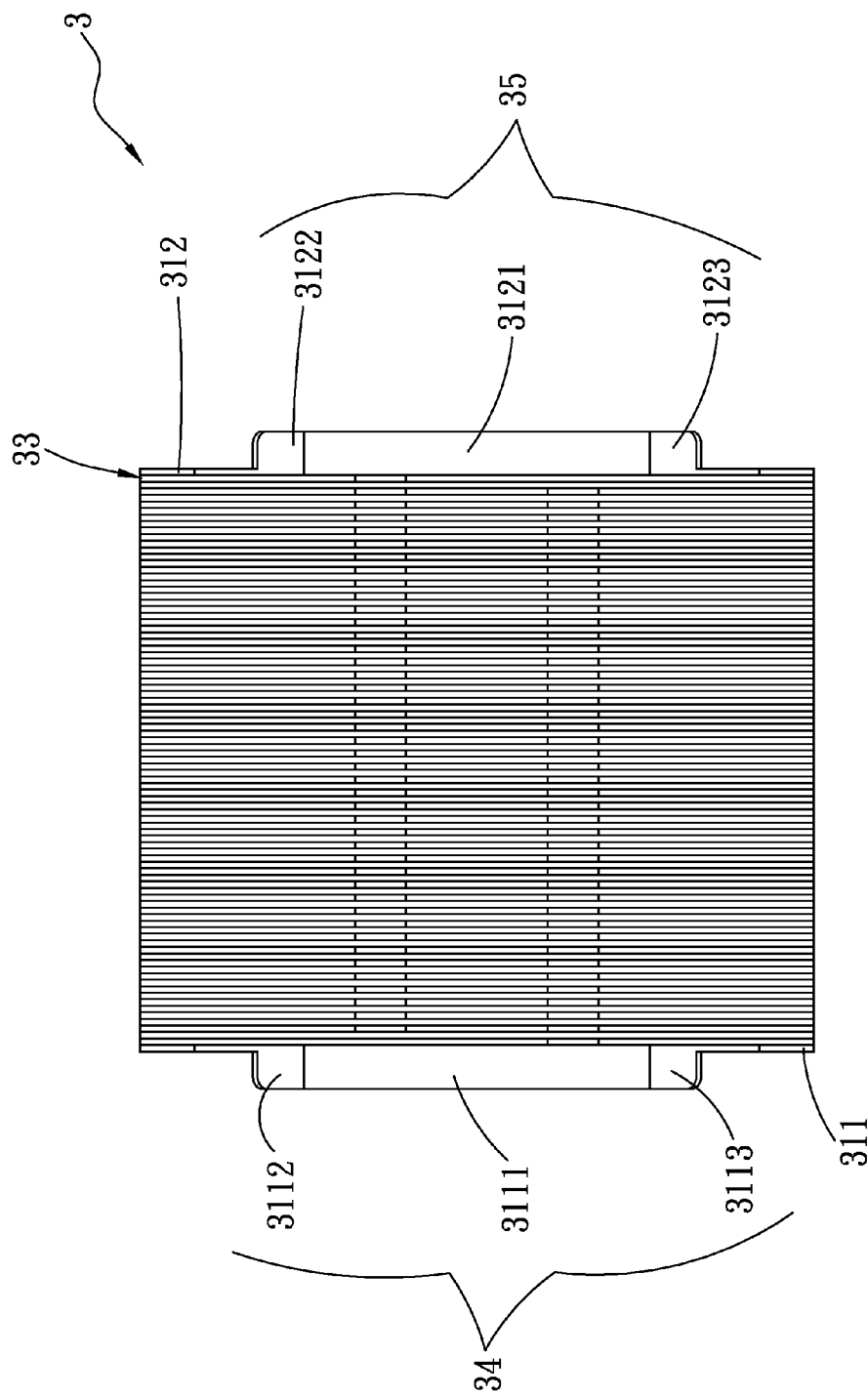
FIG. 2b is a top view of the first embodiment of the heat sink wind guide structure of the present invention.

Please refer to FIGS. 2a and 2b, in which FIG. 2a is a perspective view of a first embodiment of the heat sink wind guide structure of the present invention and FIG. 2b is a top view thereof. The heat sink wind guide structure includes a heat sink 3 having multiple radiating fins 31 and a wind incoming side 32. Each two adjacent radiating fins 31 define therebetween a heat dissipation flow way 33 in communication with the wind incoming side 32. The radiating fins 31 include a first radiating fin 311 and a second radiating fin 312, which are respectively positioned on two opposite outer sides of the heat sink 3. The first radiating fin 311 has a first extension end 3111 protruding from the first radiating fin 311. The second radiating fin 312 has a second extension end 3121 protruding from the second radiating fin 312.

In this embodiment, the heat sink 3 is composed of multiple radiating fins 31, which are piled up.

Figure 3A:
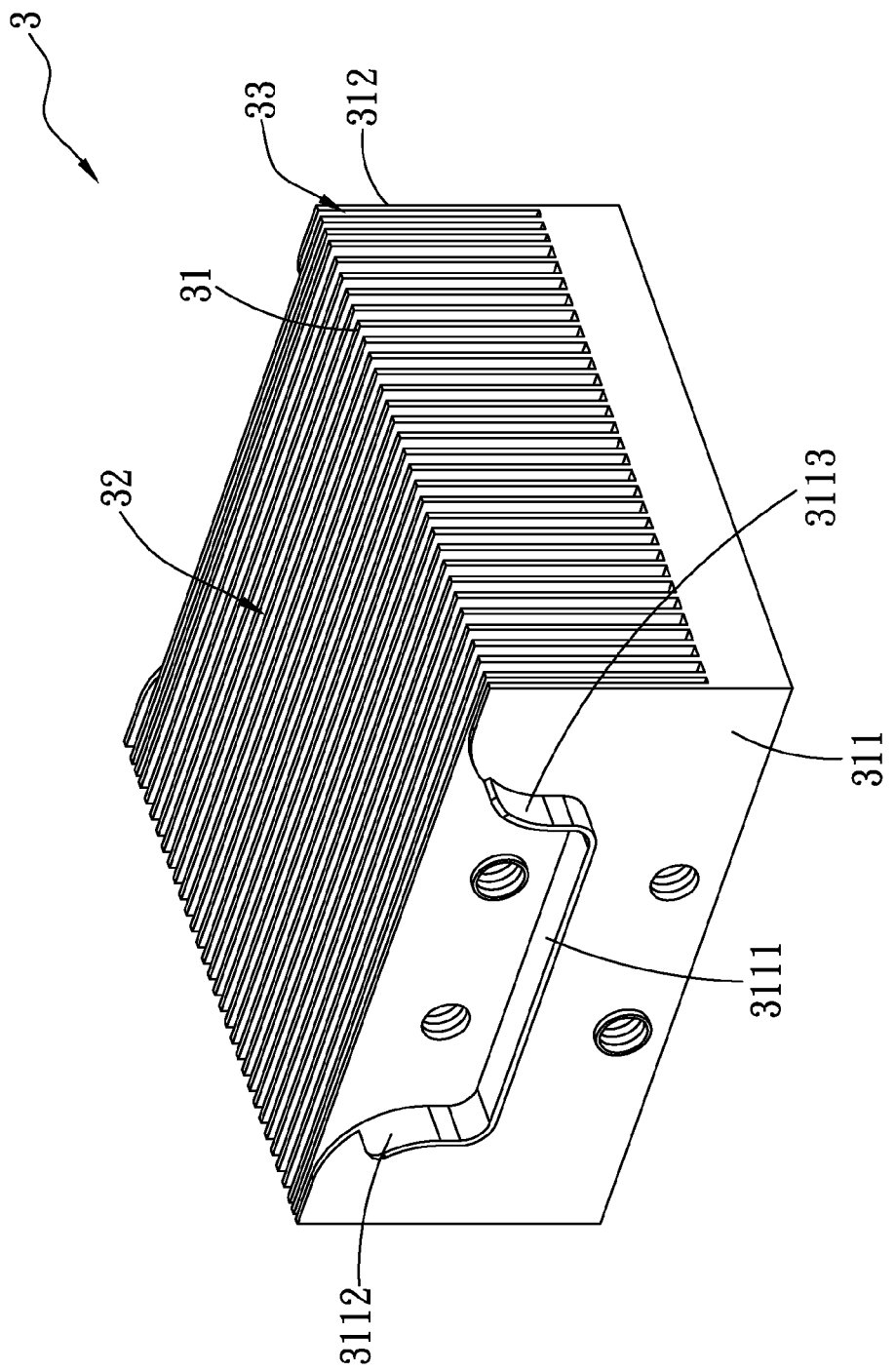
FIG. 3a is a perspective view of a second embodiment of the heat sink wind guide structure of the present invention.
Figure 3B:
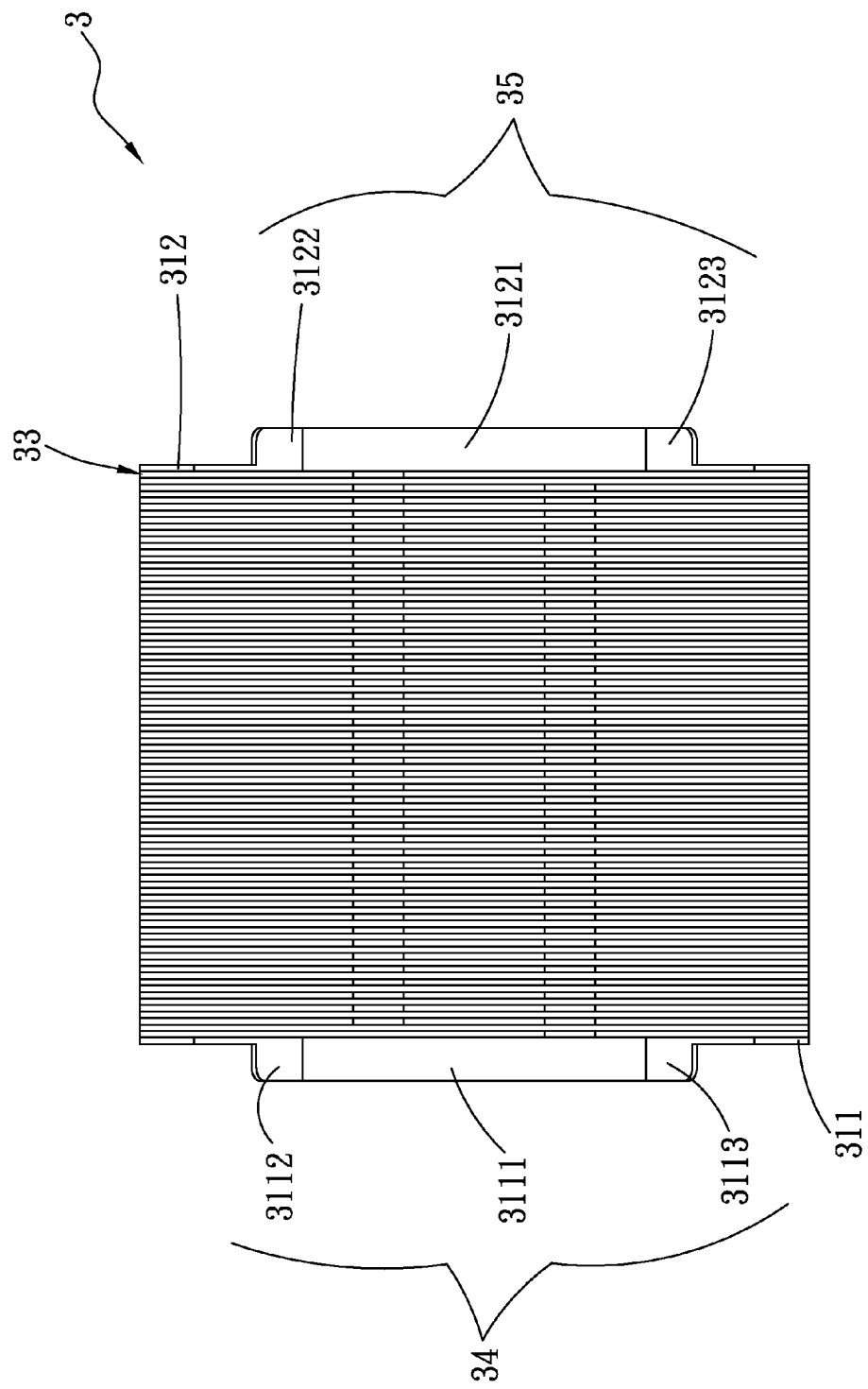
FIG. 3b is a top view of the second embodiment of the heat sink wind guide structure of the present invention.

Please refer to FIGS. 3a and 3b, in which FIG. 3a is a perspective view of a second embodiment of the heat sink wind guide structure of the present invention and FIG. 3b is a top view thereof. The heat sink 3 of the second embodiment is identical to that of the first embodiment in structure and relationship between the respective components and thus will not be repeatedly described. The second embodiment is only different from the first embodiment in that the heat sink 3 of the second embodiment is an extruded aluminum heat sink 3.

Further referring to FIGS. 2a, 2b, 3a, 3b, a first wind guide wing 3112 and a second wind guide wing 3113 are respectively connected to two sides of the first extension end 3111. The first extension end 3111 and the first and second wind guide wings 3112, 3113 together define a first wind guide passageway 34. A third wind guide wing 3122 and a fourth wind guide wing 3123 are respectively connected to two sides of the second extension end 3121. The second extension end 3121 and the third and fourth wind guide wings 3122, 3123 together define a second wind guide passageway 35.

Figure 4A:
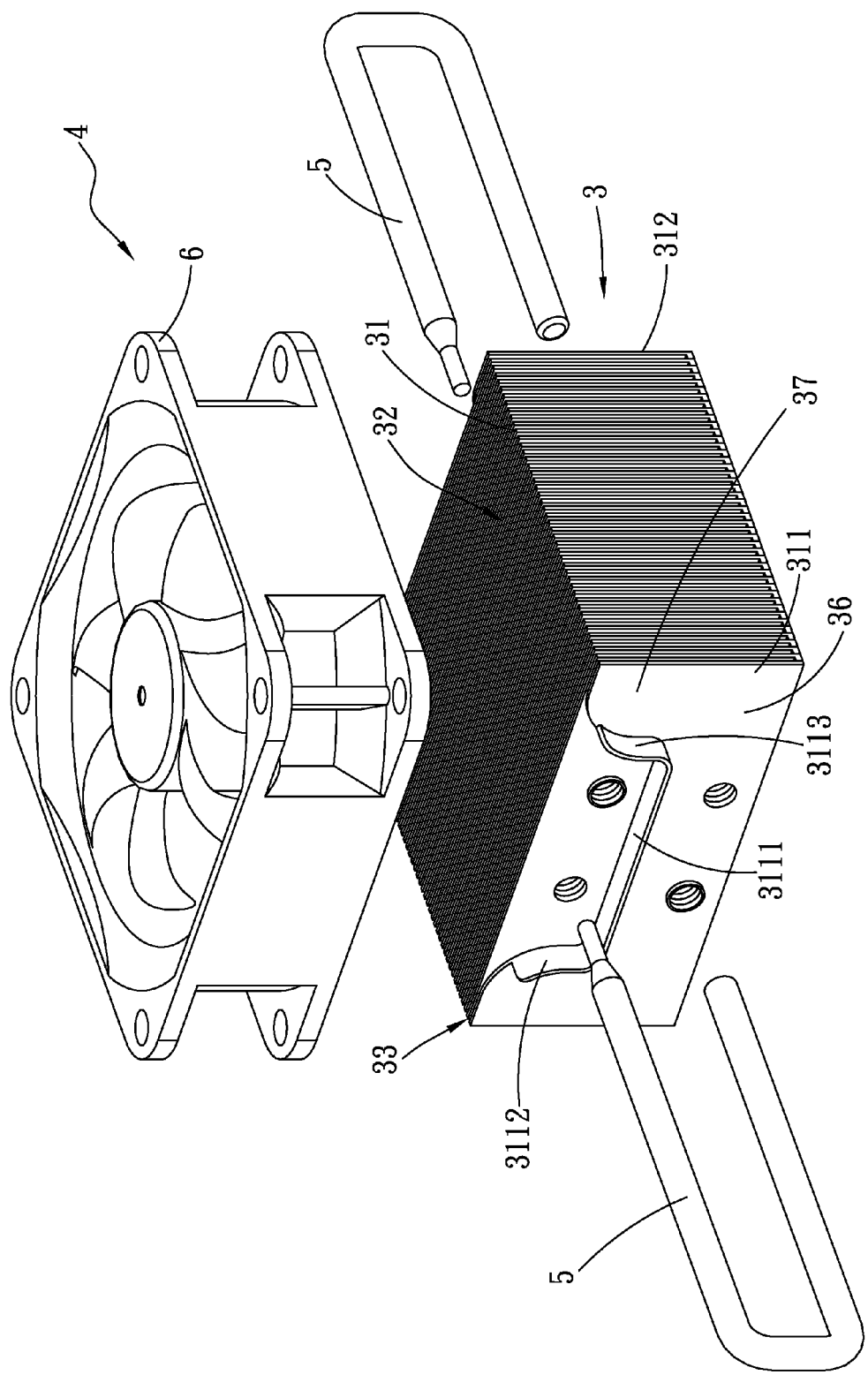
FIG. 4a is a perspective exploded view of a first embodiment of the thermal module of the present invention.
Figure 4B:
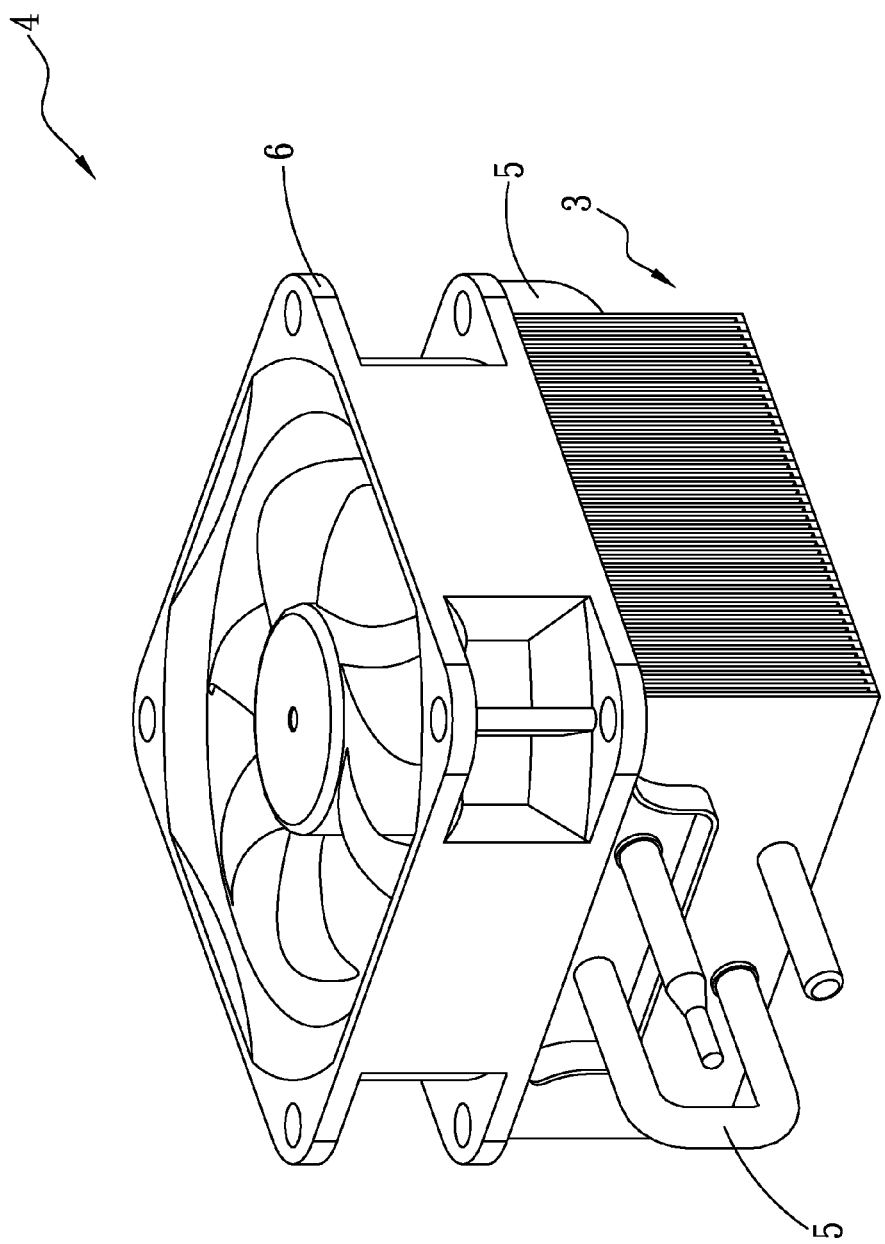
FIG. 4b is a perspective assembled view of the first embodiment of the thermal module of the present invention.
Figure 4C:
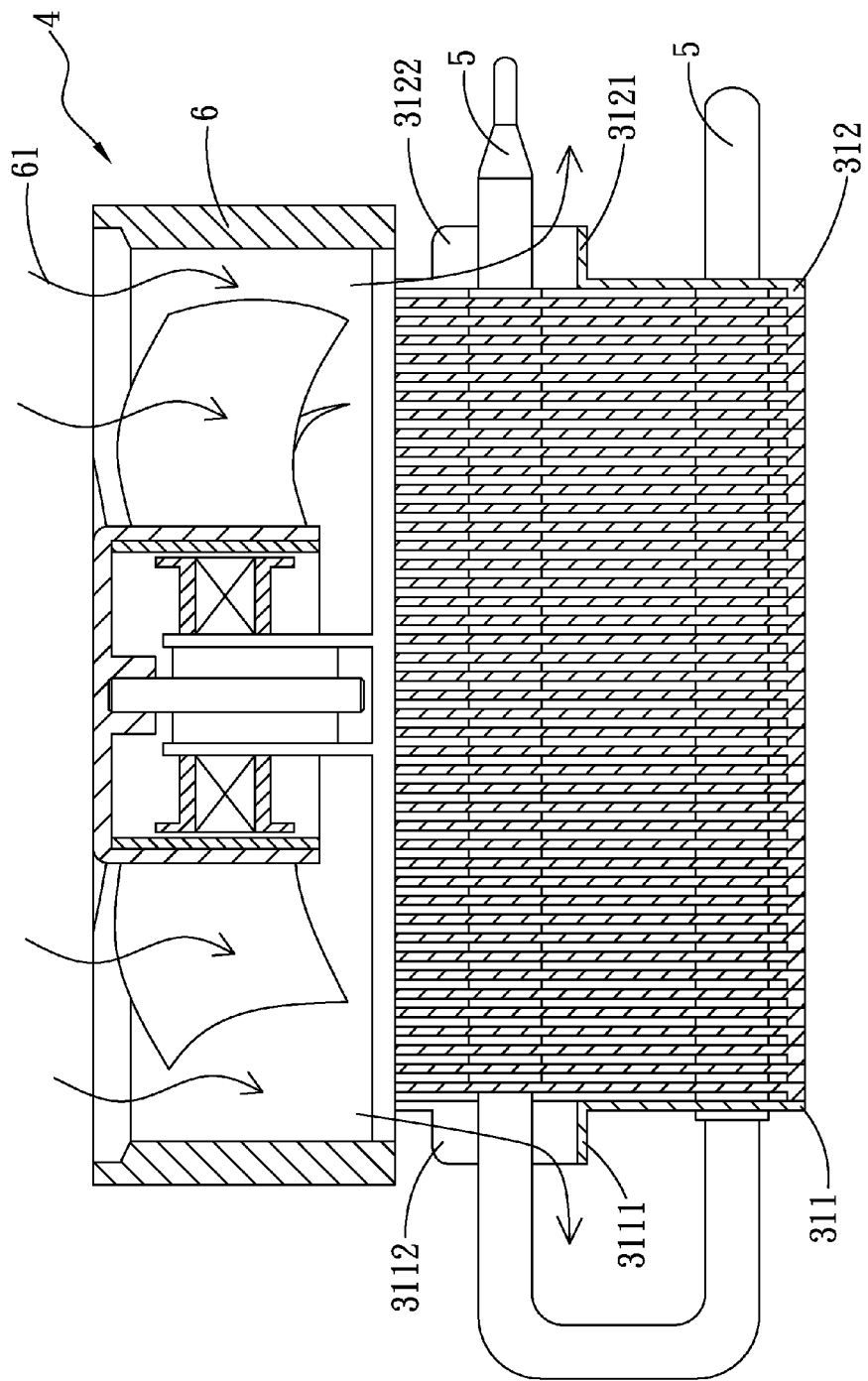
FIG. 4c is a right view of the first embodiment of the thermal module of the present invention.

Please refer to FIGS. 4a, 4b and 4c, in which FIG. 4a is a perspective exploded view of a first embodiment of the thermal module of the present invention, FIG. 4b is a perspective assembled view of the first embodiment of the thermal module of the present invention and FIG. 4c is a right view thereof. In this embodiment, the thermal module 4 includes a heat sink 3, at least one heat pipe 5 and a fan 6.

The heat sink 3 has multiple radiating fins 31 and a wind incoming side 32. Each two adjacent radiating fins 31 define therebetween a heat dissipation flow way 33 in communication with the wind incoming side 32. The radiating fins 31 include a first radiating fin 311 and a second radiating fin 312, which are respectively positioned on two opposite outer sides of the heat sink 3. The first radiating fin 311 has a first extension end 3111 protruding from the first radiating fin 311. The second radiating fin 312 has a second extension end 3121 protruding from the second radiating fin 312.

The heat pipe 5 extends through the heat sink 3. The heat sink 3 has a heat absorption section 36 and a heat dissipation section 37. Two ends of the heat pipe 3 respectively pass through the heat absorption section 36 and heat dissipation section 37 of the heat sink 3.

The fan 6 is correspondingly mated with the wind incoming side 32 of the heat sink 3 to forcedly guide airflow 61 for dissipating heat from the heat sink 3.

In this embodiment, the heat sink 3 is composed of multiple radiating fins 31, which are piled up.

Figure 5A:
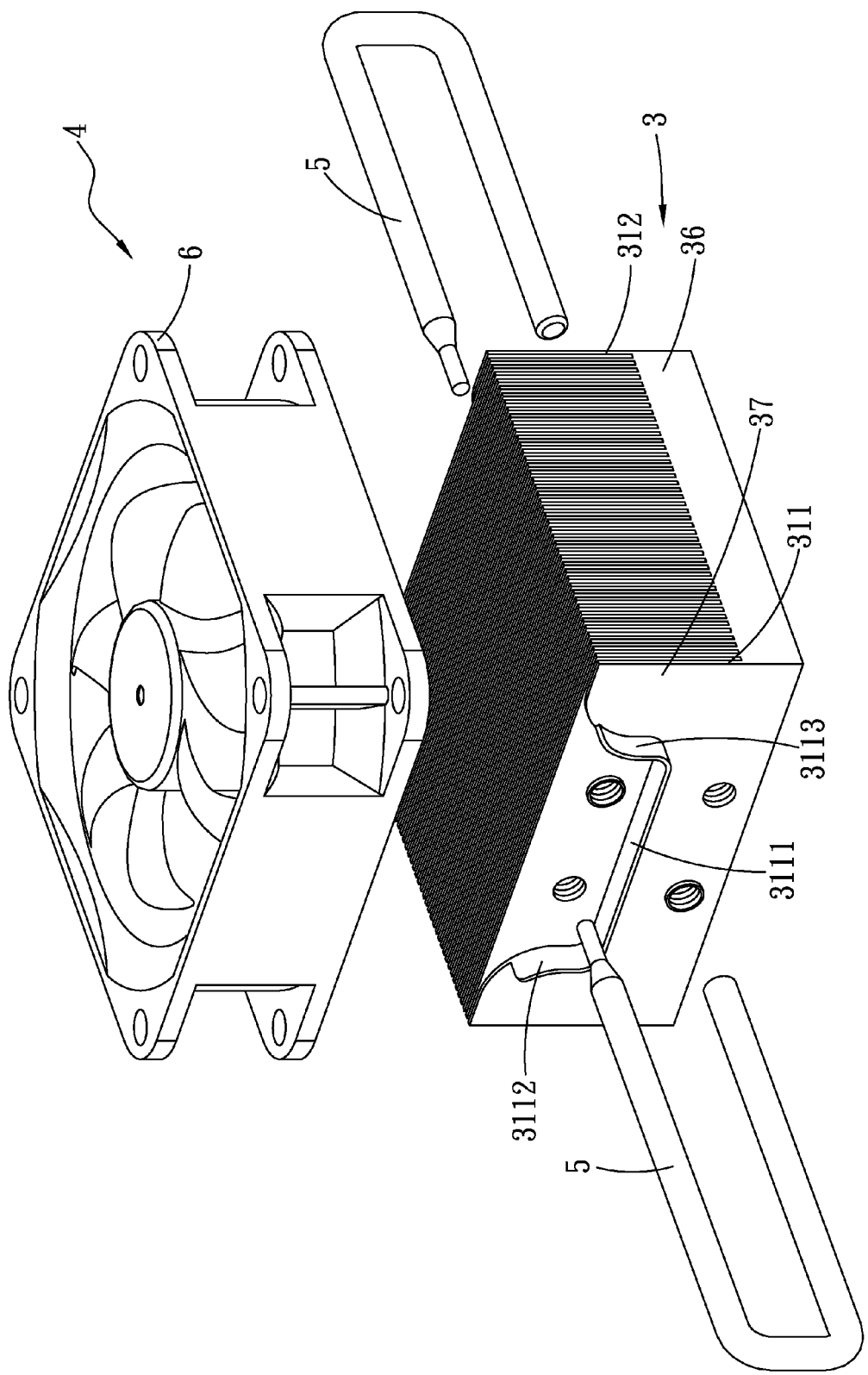
FIG. 5a is a perspective exploded view of a second embodiment of the thermal module of the present invention.
Figure 5B:
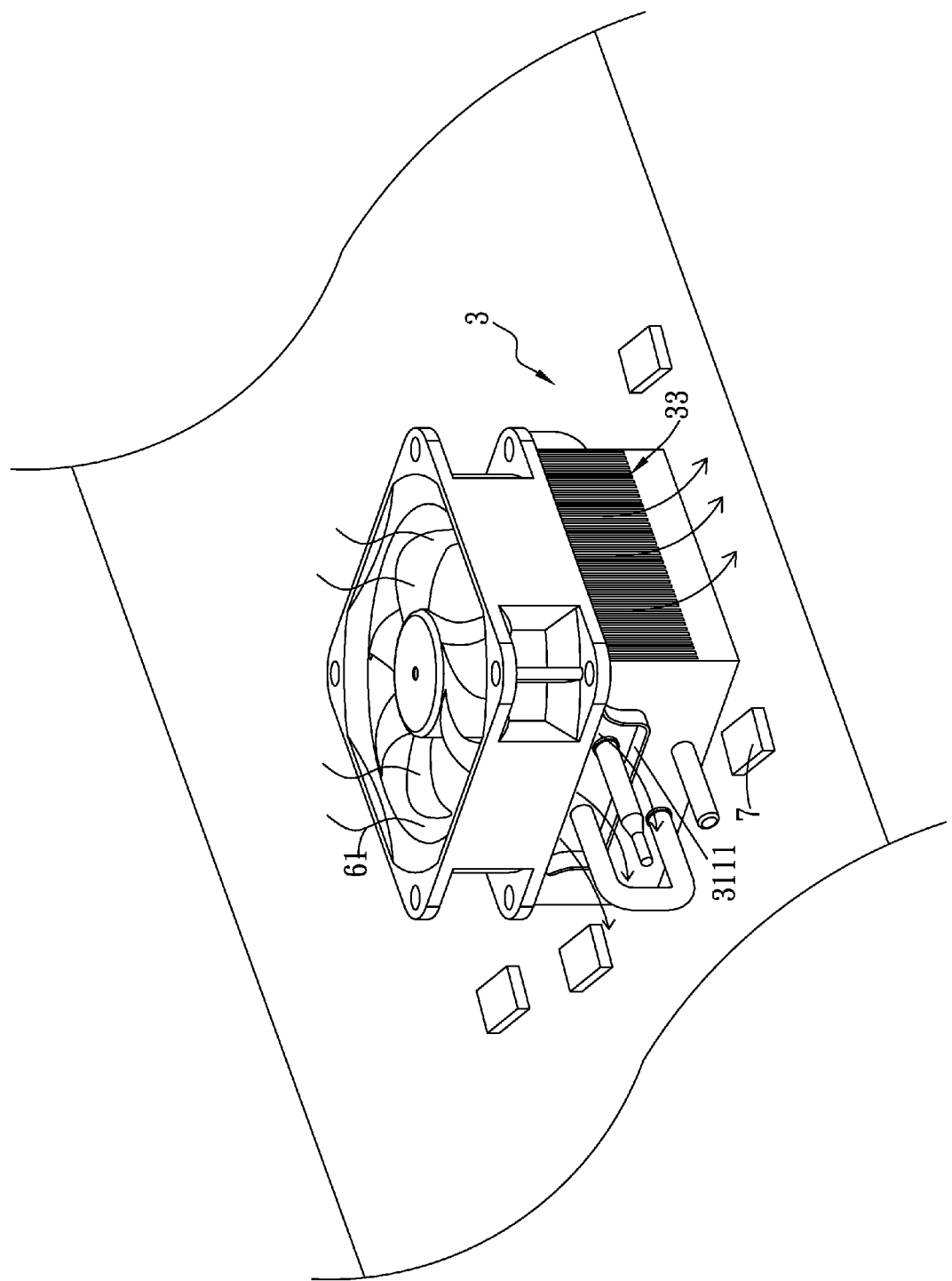
FIG. 5b is a perspective assembled view of the second embodiment of the thermal module of the present invention.
Figure 5C:
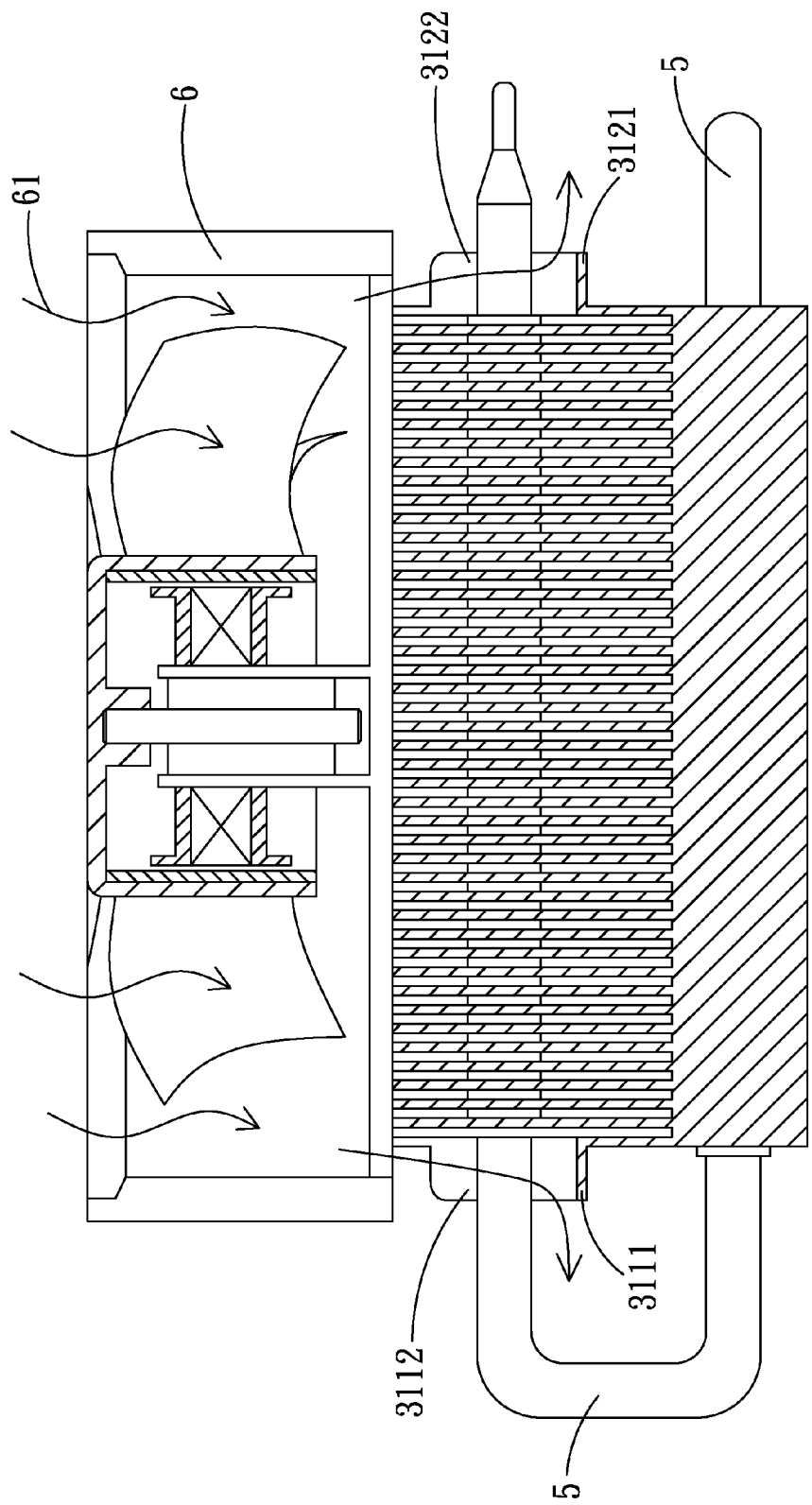
FIG. 5c is a right view of the second embodiment of the thermal module of the present invention.

Please refer to FIGS. 5a, 5b and 5c, in which FIG. 5a is a perspective exploded view of a second embodiment of the thermal module of the present invention, FIG. 5b is a perspective assembled view of the second embodiment of the thermal module of the present invention and FIG. 5c is a right view thereof. The thermal module 4 of the second embodiment is identical to that of the first embodiment in structure and relationship between the respective components and thus will not be repeatedly described. The second embodiment is only different from the first embodiment in that the heat sink 3 of the second embodiment is an extruded aluminum heat sink 3.

Further referring to FIGS. 4a, 4b, 4c, 5a, 5b and 5c, a first wind guide wing 3112 and a second wind guide wing 3113 are respectively connected to two sides of the first extension end 3111. The first extension end 3111 and the first and second wind guide wings 3112, 3113 together define a first wind guide passageway 34 (as shown in FIG. 2b). A third wind guide wing 3122 and a fourth wind guide wing 3123 are respectively connected to two sides of the second extension end 3121. The second extension end 3121 and the third and fourth wind guide wings 3122, 3123 together define a second wind guide passageway 35 (as shown in FIG. 3b).

The fan 6 serves to forcedly guide the heat dissipation airflow 61 to dissipate heat from the heat sink 3 and the heat pipe 5. The heat dissipation airflow 61 goes from the wind incoming side 32 of the heat sink 3 into the heat sink 3. Then the heat dissipation airflow 61 goes through the heat dissipation flow ways 33 and is exhausted from the heat sink 3. The first and second extension ends 3111, 3112 on the opposite sides of the heat sink 3 serve to guide the heat dissipation airflow 61 toward two other sides of the heat sink 3. In this case, the heat generated by the heat-generating units 7 arranged around the heat sink 3 can be dissipated at the same time. Accordingly, the heat dissipation airflow 61 can be exhausted from many sides of the heat sink 3 to dissipate the heat of many heat-generating units 7 at the same time.

The above embodiments are only used to illustrate the present invention, not intended to limit the scope thereof. It is understood that many changes and modifications of the above embodiments can be made without departing from the spirit of the present invention. The scope of the present invention is limited only by the appended claims.

What is claimed is:

1. A heat sink wind guide structure comprising a heat sink having multiple spaced similar radiating fins and a wind incoming side, each two adjacent radiating fins defining therebetween a first heat dissipation flow way parallel to said radiating fins in communication with the wind incoming side, the radiating fins including a first radiating fin and a second radiating fin, which are respectively positioned on two opposite outer sides of the heat sink, the first radiating fin having a first extension end protruding laterally from the first radiating fin and connecting with a side of the first radiating fin, the second radiating fin having a second extension end protruding laterally from the second radiating fin and connecting with a side of the second radiating fin, wherein said first and second extension ends are limited to said first and second radiating fins; whereby said first extension end and said second extension end direct additional heat dissipating flow perpendicular to said first and said second radiating fins, a first wind guide wing and a second wind guide wing being respectively connected to two sides of the first extension end, the first extension end and the first and second wind guide wings together defining a first wind guide passageway, third wind guide wing and a fourth wind guide wing being respectively connected to two sides of the second extension end, the second extension end and the third and fourth wind guide wings together defining a second wind guide passageway, wherein a shaped portion of said first and said second radiating fins is removed to accommodate said wing guide passageway and a first open end of the first wind guide passageway and a second open end of the second wind guide passageway being perpendicular to said first heat dissipation flow way.

2. The heat sink wind guide structure as claimed in claim 1, wherein the heat sink is composed of multiple radiating fins, which are disposed in spaced parallel relation.

3. The heat sink wind guide structure as claimed in claim 1, wherein the heat sink is an extruded aluminum heat sink.

4. A thermal module with heat sink wind guide structure, comprising:

a heat sink having multiple spaced similar radiating fins and a wind incoming side, each two adjacent radiating fins defining therebetween a first heat dissipation flow way in communication with the wind incoming side, the radiating fins including a first radiating fin and a second radiating fin, which are respectively positioned on two opposite outer sides of the heat sink, the first radiating fin having a first extension end protruding laterally from the first radiating fin and connecting with a side of the first radiating fin, the second radiating fin having a second extension end protruding laterally from the second radiating fin and connecting with a side of the second radiating fin, wherein said first and second extension ends are limited to said first and second radiating fins a first wind guide wing and a second wind guide wing being respectively connected to two sides of the first extension end, the first extension end and the first and second wind guide wings together defining a first wind guide passageway, a third wind guide wing and a fourth wind guide wing being respectively connected to two sides of the second extension end, the second extension end and the third and fourth wind guide wings together defining a second wind guide passageway, wherein a shaped portion of said first and said second radiating fins is removed to accommodate said wing guide passageway and a first open end of the first wind guide passageway and a second open end of the second wind guide passageway being perpendicular to said first heat dissipation flow way; and a fan mated with the wind incoming side of the heat sink; whereby said first extension end and said second extension end direct additional heat dissipating flow perpendicular to said first and said second radiating fins.

5. The thermal module with heat sink wind guide structure as claimed in claim 4, wherein the heat sink is composed of multiple radiating fins, which are disposed in spaced parallel relation.

6. The thermal module with heat sink wind guide structure as claimed in claim 4, wherein, the heat sink is an extruded aluminum heat sink.

7. The thermal module with heat sink wind guide structure as claimed in claim 4, wherein the heat sink has at least one heat pipe extending through the heat sink.

8. The thermal module with heat sink wind guide structure as claimed in claim 7, wherein the heat sink has a heat absorption section and a heat dissipation section, two ends of the heat pipe respectively passing through the heat absorption section and heat dissipation section of the heat sink.

\* \* \* \* \*